(12) United States Patent
Bhardwaj

(10) Patent No.: US 7,791,253 B2
(45) Date of Patent: Sep. 7, 2010

(54) MULTI-LAYER GAS MATRIX PIEZOELECTRIC COMPOSITE TRANSDUCER

(75) Inventor: Mahesh C. Bhardwaj, State College, PA (US)

(73) Assignee: The Ultran Group, Inc., State College, PA (US)

( * ) Notice: Subject to any disclaimer, the term of this patent is extended or adjusted under 35 U.S.C. 154(b) by 143 days.

(21) Appl. No.: 11/815,363

(22) PCT Filed: Feb. 8, 2006

(86) PCT No.: PCT/US2006/004434

§ 371 (c)(1),
(2), (4) Date: May 19, 2008

(87) PCT Pub. No.: WO2006/088708

PCT Pub. Date: Aug. 24, 2006

(65) Prior Publication Data

US 2008/0278036 A1   Nov. 13, 2008

Related U.S. Application Data

(60) Provisional application No. 60/653,031, filed on Feb. 15, 2005.

(51) Int. Cl.
   *H01L 41/08* (2006.01)

(52) U.S. Cl. ................................ 310/334; 310/369
(58) Field of Classification Search ......... 310/334–337, 310/369
See application file for complete search history.

(56) References Cited

U.S. PATENT DOCUMENTS

| 5,625,149 | A  | * | 4/1997  | Gururaja et al. | ............... 73/632 |
| 6,469,422 | B2 | * | 10/2002 | Fraser | ........................ 310/334 |
| 6,671,230 | B1 | * | 12/2003 | Benjamin | .................... 367/155 |
| 7,382,082 | B2 | * | 6/2008  | Bhardwaj | .................... 310/357 |
| 2003/0127949 | A1 | | 7/2003  | Nagahara et al. | |
| 2005/0236932 | A1 | * | 10/2005 | Nagahara et al. | ............ 310/328 |

* cited by examiner

*Primary Examiner*—Thomas M Dougherty
(74) *Attorney, Agent, or Firm*—The Webb Law Firm

(57) ABSTRACT

A piezoelectric transducer (10) includes (a) a first gas matrix piezoelectric composite (12) having a side including at least one positive pole (+) and another side including at least one negative pole (−); (b) a second gas matrix piezoelectric composite (14) having a side including at least one positive pole (+) and another side including at least one negative pole (−); and (c) a substrate (28) having a first side (22) and a second side (24), wherein the substrate is positioned between the first gas matrix piezoelectric composite and the second gas matrix piezoelectric composite. Either the first or second gas matrix piezoelectric composite may include a plurality of piezoelectric rods (15), wherein each piezoelectric rod includes at least one positive pole (16) end and at least one negative pole end (18).

19 Claims, 4 Drawing Sheets

| TRANSDUCER TYPE | FREQUENCY | REFLECTED SENSITIVITY (dB) |
|---|---|---|
| SINGLE GMP LAYER | 116kHz | −56 dB |
| DOUBLE LAYER GMP SERIES CONNECTION | 118kHz | −50 dB |
| DOUBLE LAYER GMP PARALLEL CONNECTION | 62kHz | −60 dB |

SOLID PIEZOELECTRIC
MATERIAL OR POLYMER MATRIX
PIEZOELECTRIC
COMPOSITE

GAS MATRIX
PIEZOELECTRIC
COMPOSITE

*FIG. 7*

SOLID PIEZOELECTRIC
MATERIAL OR POLYMER MATRIX
PIEZOELECTRIC
COMPOSITE

GAS MATRIX
PIEZOELECTRIC
COMPOSITE

*FIG. 8*

MULTI-LAYER GAS MATRIX PIEZOELECTRIC COMPOSITE TRANSDUCER

BACKGROUND OF THE INVENTION

1. Field of the Invention

This invention is in the field of piezoelectric transducers having piezoelectric cylinders isolated from a support matrix by a gas and, more particularly, a multi-layer arrangement of such piezoelectric transducers.

2. Description of Related Art

Transducers are devices that transform input signals into output signals of a different form. In ultrasound devices, they transform signals of electrical energy into acoustic energy or produce electrical signals from absorbed sound waves. In the fields of non-destructive testing of materials, biomedical, non-invasive diagnostics, and ultrasonic power generation, it is highly desired that the source (transmitter) of ultrasound, that is, the transducer device, be characterized by high transduction in the medium of transmission. It is further desired that the receiver of ultrasound be very sensitive to detect ultrasonic vibrations, irrespective of the medium or the mechanism by which they are generated.

Therefore, it is necessary to develop a piezoelectric device that is characterized by transduction efficiency higher than that produced according to the current art. Any such developments may also result in enhancing other acoustic characteristics of the transducers, such as the resonant frequency.

SUMMARY OF THE INVENTION

Briefly, according to this invention, there is provided a layered piezoelectric transducer. The underlying piezoelectric transducer in the layered piezoelectric transducer is of the type disclosed in U.S. patent application Ser. No. 10/337,531, entitled "Piezoelectric Transducer With Gas Matrix", filed Jan. 7, 2003 (now U.S. Pat. No. 7,382,082), the contents of which are incorporated herein by reference. Two gas matrix piezoelectric (GMP) composites, constructed as layers or flat discs, are laid upon each other and are preferably bonded to each other, such that the negative pole side of one GMP composite is in contact with the positive pole side of the other GMP. This arrangement results in a doubling of efficiency of transduction into the medium of transmission, as compared to utilizing a single GMP composite. This type of positive/negative pole arrangement may be identified as a series connection arrangement.

An alternative embodiment of the present invention involves layering two GMP composites upon each other and preferably bonding them to each other, such that the negative pole side of one GMP composite is in contact with the negative pole side of the other GMP. Similarly, a positive pole side of one GMP composite may be in contact with the positive pole side of the other GMP. Either of these alternative embodiment arrangements results in a decrease in efficiency of transduction in the medium of transmission, but results in an increase in resonant frequency. This type of negative/negative and positive/positive pole arrangement may be identified as a parallel connection arrangement.

Another alternative embodiment of the present invention involves layering a GMP composite with a solid piezoelectric material layer.

Other objects and features of the invention will appear in the course of the description thereof, which follows.

BRIEF DESCRIPTION OF THE DRAWINGS

FIG. 7 is a schematic drawing of a second series connection arrangement of a gas matrix piezoelectric composite and a solid piezoelectric material layer in accordance with the present invention; and FIG. 8 is a schematic drawing of a second parallel connection arrangement of a gas matrix piezoelectric composite and a solid piezoelectric material layer in accordance with the present invention.

DESCRIPTION OF THE PREFERRED EMBODIMENTS

The present invention encompasses the subject matter disclosed in U.S. patent application Ser. No. 10/337,531 (hereinafter "the '531 application"), now U.S. Pat. No. 7,382,082, entitled "Piezoelectric Transducer With Gas Matrix", filed Jan. 7, 2003, the contents of which are incorporated herein by reference. Therein, it is explained: The transducer comprises a plurality of piezoelectric cylinders. The axial length and composition of the piezoelectric cylinders determine the frequency of the transducers when excited. The axial ends of the piezoelectric cylinders are aligned with the faces. The piezoelectric cylinders are separated from each other in a manner to substantially reduce or substantially eliminate crosstalk. The piezoelectric cylinders or fibers may be separated from each other by a space that is empty or a space that is partially empty of matrix material resulting in a gap between the cylinders and the material so that cylinders and material are substantially entirely unconnected. The piezoelectric cylinders are separated from each other by a distance that is preferably less than the acoustic wavelength at the frequency of the piezoelectric cylinders or fibers in the space between the cylinders.

Figure 1:
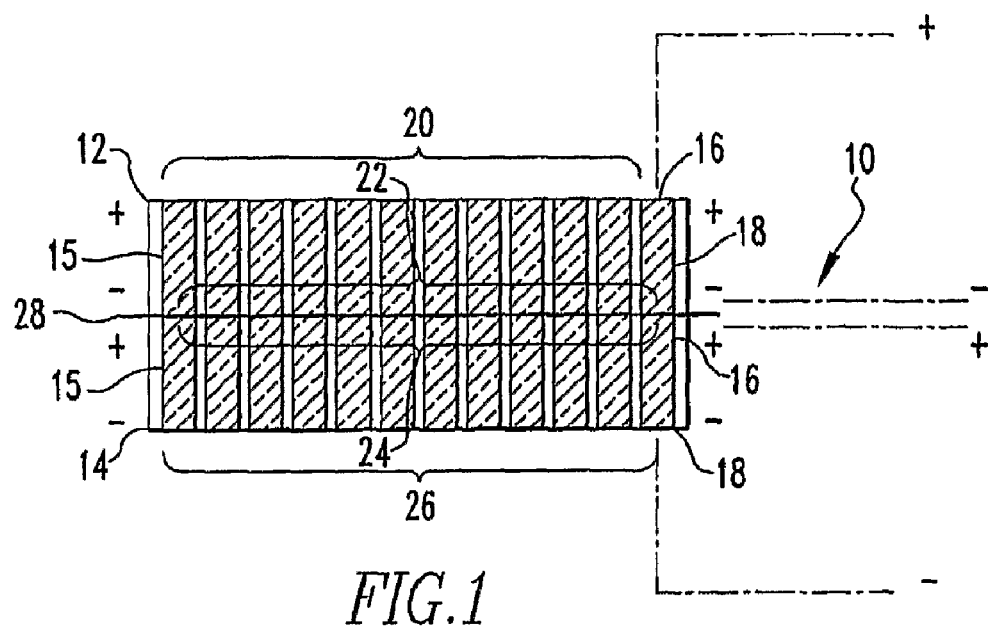
FIG. 1 is a schematic drawing of a series connection arrangement of gas matrix piezoelectric composites in accordance with the present invention.

A gas matrix piezoelectric series connection transducer arrangement 10 is illustrated in FIG. 1. The gas matrix piezoelectric series connection transducer arrangement 10 includes at least two gas matrix piezoelectric composites, such as a first gas matrix piezoelectric composite 12 and a second gas matrix piezoelectric composite 14. Each gas matrix piezoelectric composite 12, 14 is constructed in the manner specified in the '531 application. Preferably, the first gas matrix piezoelectric composite 12 is of same or similar construction as the second gas matrix piezoelectric composite 14. Both the first gas matrix piezoelectric composite 12 second gas matrix piezoelectric composite 14 include solid piezoelectric rods 15. Each piezoelectric rod 15 includes a positive pole end 16 and negative pole end 18. Thus, the first gas matrix piezoelectric composite 12 includes a positively charged side 20 and a negatively charged side 22. Similarly, the second gas matrix piezoelectric composite 14 also includes a positively charged side 24 and a negatively charged side 26.

The first gas matrix piezoelectric composite 12 is positioned over the second gas matrix piezoelectric composite 14, although it is to be understood that the position of the first and second gas matrix piezoelectric composites 12, 14 may be reversed, so that the second gas matrix piezoelectric composite 14 is above the first gas matrix piezoelectric composite 12. Thus, the negatively charged side 22 of the first gas matrix piezoelectric composite 12 is adjacent to the positively charged side 24 of the second gas matrix piezoelectric composite 14. The ability to reverse the positions of the first and second gas matrix piezoelectric composites 12, 14 allows the negatively charged side 26 of the second gas matrix piezoelectric composite 14 to be positioned adjacent to the positively charged side 20 of the first gas matrix piezoelectric composite 12. The objective is thus to position a positively charged side 24, 20 adjacent to a negatively charged side 22, 26, respectively. Thus, two layers of gas matrix piezoelectric composites are in electrical communication with each other. Preferably, the positive pole end 16 and negative pole end 18 of each piezoelectric rod 15 are electrically connected (electrical connections shown in phantom) to a transducer excitation mechanism (not shown), such as an oscillator, and square or spike pulsers. It is desirable, but not required, that the solid piezoelectric rods 15 of the first gas matrix piezoelectric composite 12 be aligned with and/or matched, in a vertical relation, to the solid piezoelectric rods 15 of the second gas matrix piezoelectric composite 14. Thus, an offset may exist between the solid piezoelectric rods 15 and/or the first and second gas matrix piezoelectric composites 12, 14 as a whole.

The gas matrix piezoelectric series connection transducer arrangement 10, as illustrated in FIG. 1, further includes a substrate 28. The substrate 28 may be an electrode foil or sheet, and is preferably thin and electrically conductive. The thickness of the substrate 28 may be between $\sim 1/10^5$ to $< 1/10^3$ of the wavelength of the resonant frequency of either the first or second gas matrix piezoelectric composite 12, 14. The substrate may be constructed of metal or any other electrically conductive material. In the exemplary embodiment of FIG. 1, one side of the substrate 28 is bonded, preferably mechanically, to the negatively charged side 22 of the first gas matrix piezoelectric composite 12 and the other side of the substrate 28 is bonded to the positively charged side 24 of the second gas matrix piezoelectric composite 14. The substrate 28 may be used between any two sides of the gas matrix piezoelectric composites 12, 14 where such two sides are positioned adjacent to each other. Thus, the substrate 28 ensures an electrical connection of all piezoelectric cylinders of each transducer. The substrate 28 is also electrically connected to a transducer excitation mechanism (not shown), such as an oscillator, and square or spike pulsers.

The ultrasonic response of the transducer may be modified by utilizing other substrate materials between the first gas matrix piezoelectric composite 12 and the second gas matrix piezoelectric composite 14. For example, other thin and acoustically transparent materials, such as metals, ceramics, polymers, or combinations thereof, may be utilized as substrate material. If these materials are used, it is preferred that their thickness be between $\sim 1/10^5$ to $< 1/10^3$ of the wavelength of the resonant frequency of the gas matrix piezoelectric composite.

Figure 3:
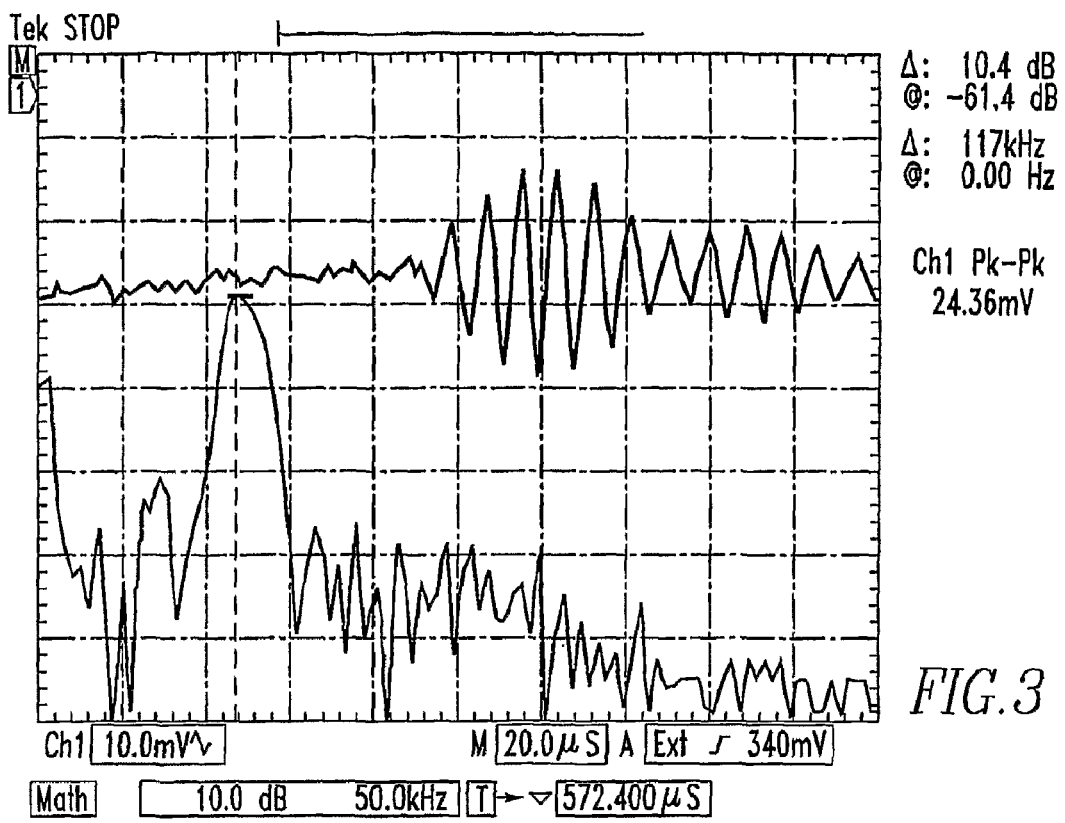
FIG. 3 is an oscilloscope trace showing a time and frequency domain analysis of a single-layer gas matrix piezoelectric transducer.

FIG. 3 illustrates an oscilloscope trace showing a time and frequency domain analysis of a single-layer gas matrix piezoelectric transducer. Specifically, FIG. 3 shows a reflected signal of ultrasound from a flat target in ambient air at a distance of 100 mm from the transducer by utilizing a single layer of 120 kHz gas matrix piezoelectric composite. The active area of the transducer is 63×63 mm. In this instance, the excitation voltage was 16 volts peak-to-peak and the transducer was excited by a 200 volts −ve spike pulser through a sine wave. Under the aforementioned conditions, a peak frequency of 117 kHz and bandwidth center frequency of 116 kHz was observed. A bandwidth at −6 dB is 28 kHz and the reflected sensitivity is −56 dB.

Figure 4:
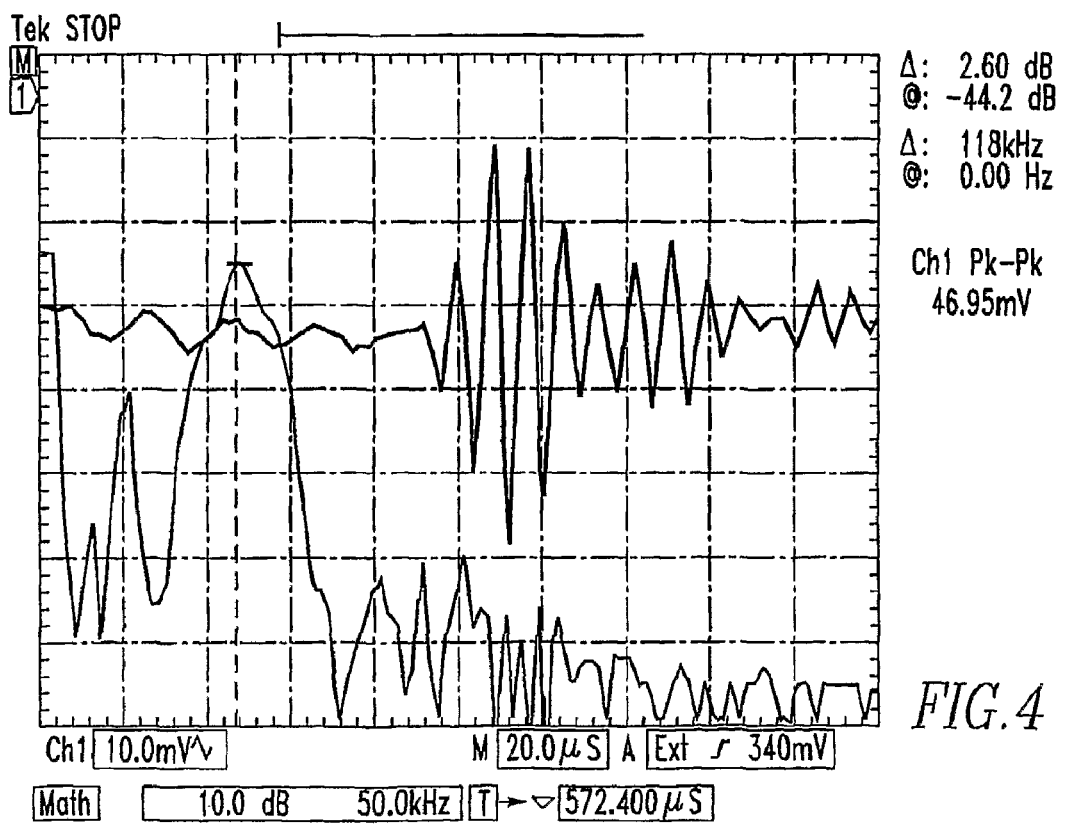
FIG. 4 is an oscilloscope trace showing a time and frequency domain analysis of a double-layer series connection transducer arrangement.

FIG. 4 illustrates an oscilloscope trace showing a time and frequency domain analysis of the double-layer series connection transducer arrangement 10. A peak frequency of 118 kHz and bandwidth center frequency of 119 kHz was observed. A bandwidth at −6 dB is 40 kHz and the reflected sensitivity is −50 dB. The double-layer series connection transducer arrangement 10 was subject to the same excitation variables as the single-layer gas matrix piezoelectric transducer.

Figures 5, 6:
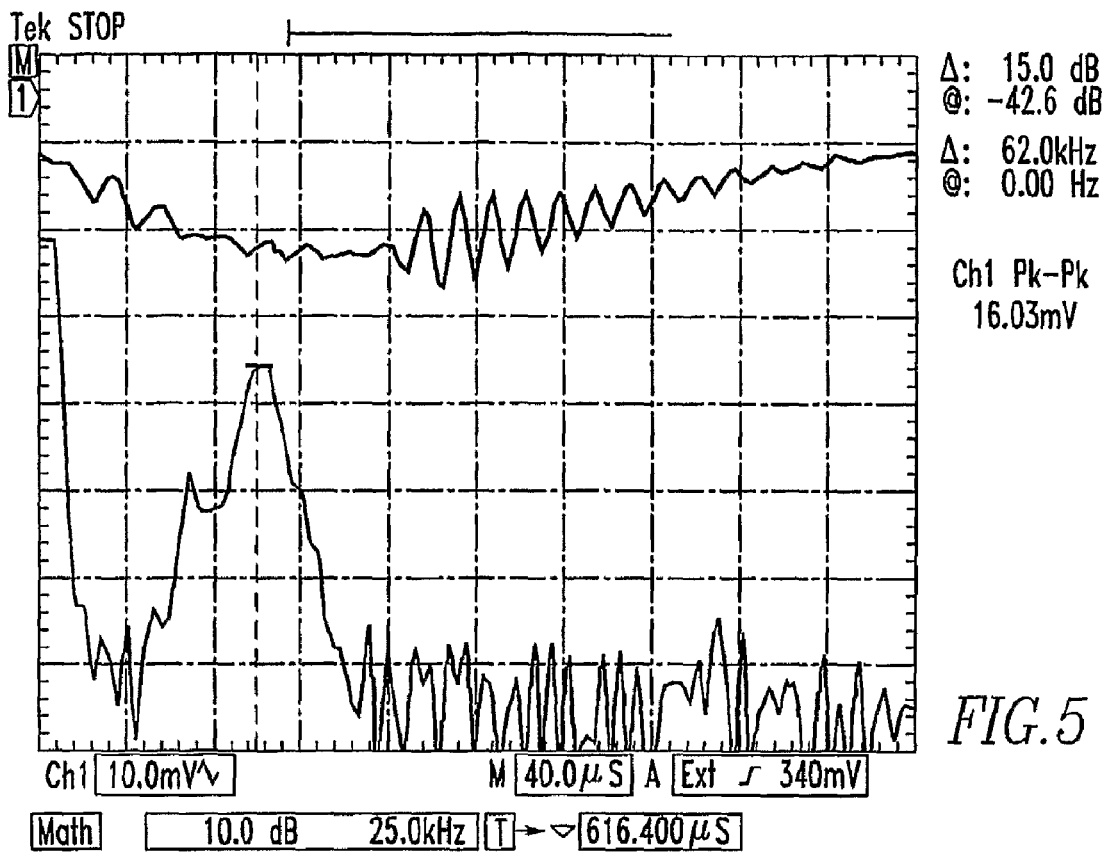
FIG. 5 is an oscilloscope trace showing a time and frequency domain analysis of the double-layer parallel connection transducer arrangement.
FIG. 6 is a table outlining acoustic characteristics of the parallel and series arrangements where the resonant frequency of each gas matrix piezoelectric composite is ~120 kHz.

FIG. 5 illustrates an oscilloscope trace showing a time and frequency domain analysis of a double-layer parallel connection transducer arrangement 30. A peak frequency of 62 kHz and bandwidth center frequency of 62 kHz was observed. A bandwidth at −6 dB is 15 kHz and the reflected sensitivity is −60 dB. The double-layer parallel connection transducer arrangement 30 was subject to the same excitation variables as the single-layer gas matrix piezoelectric transducer.

As shown in the table of FIG. 6, each arrangement of the gas matrix piezoelectric composites 12, 14 exhibits varying salient acoustic characteristics including, but not limited to, frequency and reflected sensitivity. Specifically, with the knowledge that the efficiency of the transducers is measured by the reflected sensitivity, one can see that the efficiency of the double-layer series connection arrangement (i.e., −50 dB) is twice that of the efficiency of the single-layer gas matrix piezoelectric transducer (i.e., −56 dB). It can also be observed that the resultant frequency of the double-layer parallel connection arrangement (i.e., 62 kHz) is approximately half of the resultant frequency of the single-layer gas matrix piezoelectric transducer (i.e., 116 kHz). Thus, it is evident that either the gas matrix piezoelectric series connection transducer arrangement 10 or the gas matrix piezoelectric parallel connection transducer arrangement 30 may be utilized in transducer applications depending upon the requirements of such applications.

If similar transducers based upon solid piezoelectric materials or polymer matrix piezoelectric composites were made and tested, one would see nearly opposite observations, except that in the series connection arrangement there is no increment in the transducer efficiency, as observed with gas matrix piezoelectric composite transducers. When transducer devices according to the present invention and suitable for ultrasound transmission in water and solid materials were tested, observations similar to those described for non-contact gas matrix piezoelectric transducers in the above sections were seen. Transducers produced by the combinations of polymer matrix composites and solid piezoelectric ceramic discs, individually and collectively analogous to the present invention, did not produce similar observations. Specifically, the efficiency was either reduced or remained the same when compared with such transducers' single-layered counterparts. Thus, the uniqueness of using gas matrix piezoelectric transducers is evidenced.

Figure 2:
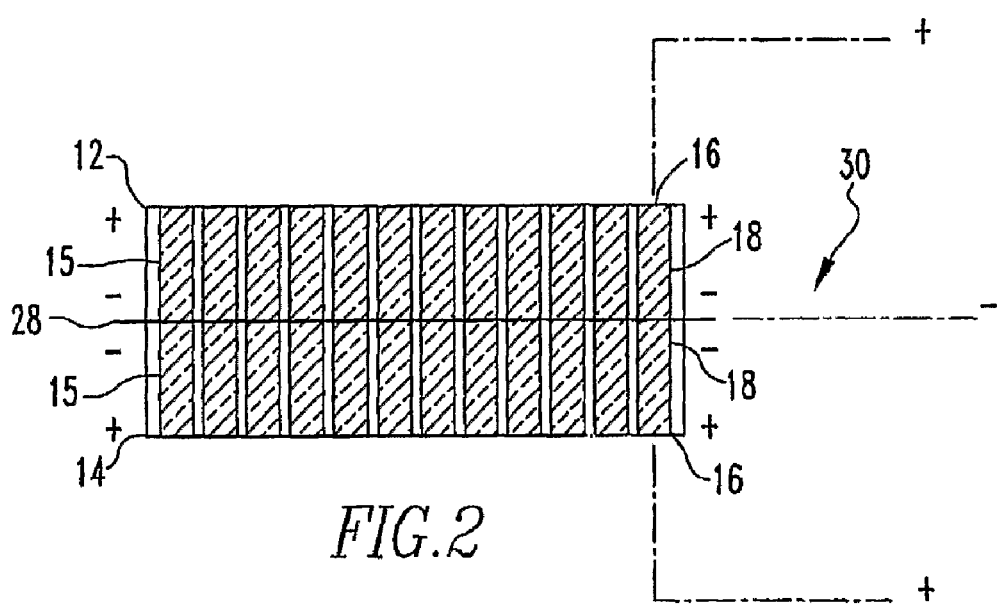
FIG. 2 is a schematic drawing of a parallel connection arrangement of gas matrix piezoelectric composites in accordance with the present invention.

An alternative embodiment of the present invention includes a gas matrix piezoelectric parallel connection transducer arrangement 30, as shown in FIG. 2. Similar to the gas matrix piezoelectric series connection transducer arrangement 10 of FIG. 1, the first gas matrix piezoelectric composite 12 is positioned over the second gas matrix piezoelectric composite 14. Again, it is to be understood that the position of the first and second gas matrix piezoelectric composites 12, 14 may be reversed. In the gas matrix piezoelectric parallel connection transducer arrangement 30, the negatively charged side 22 of the first gas matrix piezoelectric composite 12 is adjacent to the negatively charged side 26 of the second gas matrix piezoelectric composite 14. Similarly, although not shown, the positively charged sides 20, 24 may be adjacent to each other. Thus, the alternative embodiment may include gas matrix piezoelectric composites 12, 14 with same polarity sides adjacent to each other. As with the gas matrix piezoelectric series connection transducer arrangement 10, the two layers of gas matrix piezoelectric composites are in electrical communication with each other. Additionally, the substrate 28 may be used between the first gas matrix piezoelectric composite 12 and the second gas matrix piezoelectric composite 14. The components of the gas matrix piezoelectric parallel connection transducer arrangement 30 may also be electrically connected to a transducer excitation mechanism (not shown), such as an oscillator, and square or spike pulsers.

With continuing reference to FIGS. 1 and 2, in another alternative embodiment, as shown in FIGS. 7 and 8, a multiple layer transducer may include a gas matrix piezoelectric composite and a solid piezoelectric material layer in electrical communication with each other. The substrate 28 may also be used between the two layers, wherein the substrate 28 is also electrically connected (electrical connections shown in phantom) to a transducer excitation mechanism (not shown), such as an oscillator, and square or spike pulsers. In this alternative embodiment, the multiple layer transducer may embody either a series or a parallel connection arrangement. The resultant sensitivity, and hence, efficiency, is lower in this alternative embodiment than the resultant sensitivity of transducers utilizing two layers of gas matrix piezoelectric composites.

Although the aforementioned description details the use of the first and second gas matrix piezoelectric composites 12, 14 to form the gas matrix piezoelectric series connection transducer arrangement 10 and the gas matrix piezoelectric parallel connection transducer arrangement 30, it should be appreciated that transducers including more than two layers may be constructed. Thus, depending upon the types of connections made between the layers, the acoustic response may be further modified by utilizing multiple layer gas matrix piezoelectric transducers. Additionally, the above experiments were conducted through an air medium, however, it is to be understood that by proper acoustic impedance matching of multiple layer gas matrix piezoelectric transducers, transducers for operation in direct contact, through delayed contact, or through water/liquid contact may also be constructed.

Having thus described my invention with the detail and particularity required by the Patent Laws, what is desired protected by Letters Patent is set forth in the following claims.

The invention claimed is:
1. A piezoelectric transducer comprising:
   first and second gas matrix composites comprising a plurality of piezoelectric cylinders separated from each other by a space that is empty or partially empty of matrix material resulting in a gap between cylinders so that the cylinders and matrix material, if any, are substantially entirely unconnected and the piezoelectric cylinders are separated from each other by a distance less than the acoustic wavelength at the frequency of the piezoelectric cylinders;
   a first gas matrix piezoelectric composite having a side comprising at least one positive pole and another side comprising at least one negative pole;
   a second gas matrix piezoelectric composite having a side comprising at least one positive pole and another side comprising at least one negative pole; and
   a substrate having a first side and a second side, wherein the substrate is positioned between the first gas matrix piezoelectric composite and the second gas matrix piezoelectric composite.

2. The piezoelectric transducer of claim 1, wherein the negative pole side of the first gas matrix piezoelectric composite is adjacent to the first side of the substrate and the positive pole side of the second gas matrix piezoelectric composite is adjacent to the second side of the substrate.

3. The piezoelectric transducer of claim 2, wherein the substrate is mechanically bonded to the first gas matrix piezoelectric composite and the second gas matrix piezoelectric composite.

4. The piezoelectric transducer of claim 3, wherein the substrate is of an electrically conductive material, wherein the material is one of a metal, ceramic, and polymer.

5. The piezoelectric transducer of claim 4, wherein the thickness of the substrate is between $\sim 1/10^5$ to $< 1/10^3$ of the wavelength of the resonant frequency of one of the first gas matrix piezoelectric composite and the second gas matrix piezoelectric composite.

6. The piezoelectric transducer of claim 2, wherein one of the first gas matrix piezoelectric composite and the second gas matrix piezoelectric composite is comprised of a plurality of piezoelectric rods, each piezoelectric rod including at least one positive pole end and at least one negative pole end.

7. The piezoelectric transducer of claim 6, wherein the piezoelectric rods of the first gas matrix piezoelectric composite are in an offset relation to the piezoelectric rods of the second gas matrix piezoelectric composite.

8. The piezoelectric transducer of claim 1, wherein the positive pole side of the first gas matrix piezoelectric composite is adjacent to the first side of the substrate and the positive pole side of the second gas matrix piezoelectric composite is adjacent to the second side of the substrate.

9. The piezoelectric transducer of claim 8, wherein the substrate is mechanically bonded to the first gas matrix piezoelectric composite and the second gas matrix piezoelectric composite.

10. The piezoelectric transducer of claim 9, wherein the substrate is of an electrically conductive material, wherein the material is one of a metal, ceramic, and polymer.

11. The piezoelectric transducer of claim 10, wherein the thickness of the substrate is between $\sim 1/10^5$ to $< 1/10^3$ of the wavelength of the resonant frequency of one of the first gas matrix piezoelectric composite and the second gas matrix piezoelectric composite.

12. The piezoelectric transducer of claim 8, wherein one of the first gas matrix piezoelectric composite and the second gas matrix piezoelectric composite is comprised of a plurality of piezoelectric rods, each piezoelectric rod including at least one positive pole end and at least one negative pole end.

13. The piezoelectric transducer of claim 12, wherein the piezoelectric rods of the first gas matrix piezoelectric composite are in an offset relation to the piezoelectric rods of the second gas matrix piezoelectric composite.

14. The piezoelectric transducer of claim 1, wherein the negative pole side of the first gas matrix piezoelectric composite is adjacent to the first side of the substrate and the negative pole side of the second gas matrix piezoelectric composite is adjacent to the second side of the substrate.

15. The piezoelectric transducer of claim 14, wherein the substrate is mechanically bonded to the first gas matrix piezoelectric composite and the second gas matrix piezoelectric composite.

16. The piezoelectric transducer of claim 15, wherein the substrate is of an electrically conductive material, wherein the material is one of a metal, ceramic, and polymer.

17. The piezoelectric transducer of claim 16, wherein the thickness of the substrate is between $\sim 1/10^5$ to $<1/10^3$ of the wavelength of the resonant frequency of one of the first gas matrix piezoelectric composite and the second gas matrix piezoelectric composite.

18. The piezoelectric transducer of claim 14, wherein one of the first gas matrix piezoelectric composite and the second gas matrix piezoelectric composite is comprised of a plurality of piezoelectric rods, each piezoelectric rod including at least one positive pole end and at least one negative pole end.

19. The piezoelectric transducer of claim 18, wherein the piezoelectric rods of the first gas matrix piezoelectric composite are in an offset relation to the piezoelectric rods of the second gas matrix piezoelectric composite.

* * * * *